United States Patent [19]

Matsumoto et al.

[11] Patent Number: 5,527,729
[45] Date of Patent: Jun. 18, 1996

[54] METHOD OF MANUFACTURING A CAPACITOR HAVING METAL ELECTRODES

[75] Inventors: Shoji Matsumoto, Kyoto; Yoshihisa Nagano, Suita; Yasuhiro Shimada, Osaka; Yasufumi Izutsu, Mukou, all of Japan

[73] Assignee: Matsushita Electronics Corporation, Osaka, Japan

[21] Appl. No.: 412,563

[22] Filed: Mar. 29, 1995

[30] Foreign Application Priority Data

Mar. 30, 1994 [JP] Japan ................................. 6-060883
Apr. 25, 1994 [JP] Japan ................................. 6-086686
Dec. 28, 1994 [JP] Japan ................................. 6-327667

[51] Int. Cl.⁶ .......................... H01L 21/70; H01L 27/00
[52] U.S. Cl. .......................... 437/60; 437/919; 437/245
[58] Field of Search ................. 437/47, 52, 48, 437/60, 919, 245; 156/652.1, 650.1, 643.1; 365/145; 148/DIG. 14

[56] References Cited

U.S. PATENT DOCUMENTS 5,173,437  12/1992  Chi ............................................ 437/60
5,286,667  2/1994  Lin et al. .................................. 437/52
5,439,840  8/1995  Jones, Jr. et al. ....................... 437/52

FOREIGN PATENT DOCUMENTS 6-112169  4/1994  Japan.

*Primary Examiner*—Olik Chaudhuri
*Assistant Examiner*—H. Jey Tsai
*Attorney, Agent, or Firm*—Willian Brinks Hofer Gilson & Lione

[57] ABSTRACT

On a silicon substrate, a silicon oxide layer, a first platinum layer, a dielectric film and a second platinum layer are formed, and then the second platinum layer and the dielectric film are dry etched, via a resist layer, in a 1–5 Pa low pressure region with a mixed gas of HBr and $O_2$ as the etching gas. As soon as the first platinum layer is exposed, the unetched portion of dielectric film is etched off in a 5–50 Pa high pressure region, and then the first platinum layer is dry etched again in the low pressure region to form a capacitor consisting of a top electrode, a capacitance insulation layer and a bottom electrode in a semiconductor integrated circuit chip. Using this manufacturing method prevents the deterioration in definition caused by the use of a thick resist and the operation failure of circuit elements such as transistors due to over etching on the insulation layer.

3 Claims, 8 Drawing Sheets

METHOD OF MANUFACTURING A CAPACITOR HAVING METAL ELECTRODES

FIELD OF THE INVENTION

This invention relates to a method for manufacturing a semiconductor integrated circuit chip having a built-in capacitor in which high dielectric constant material or ferroelectric material is used as a capacitance insulation layer.

BACKGROUND OF THE INVENTION

Recently, remarkable developments have occurred in the field of microcomputers having built-in capacitors of high dielectric constant materials. Such microcomputers contribute to reducing unnecessary radiation that causes electromagnetic interference. Equally remarkable are developments in the field of ferroelectric non-volatile RAM which facilitates low-voltage operation and high read/write speed. The high dielectric constant materials or ferroelectric materials are made mainly of sintered metal oxide, and contain a substantial amount of very reactive oxygen. In forming a capacitor with such dielectric film, material for its electrodes must be least reactive; thus, precious metals such as platinum (Pt), palladium (Pd), etc. must be used.

In the prior art, platinum and palladium etching has been conducted by means of isotropic etching, such as wet etching with aqua regia or by ion milling with Ar gas. Because of the nature of isotropic etching, using wet etching with aqua regia and ion milling causes deteriorated processing accuracy. Furthermore, an additional problem with ion milling occurs because the etching speed on platinum, which is to form the electrode, and on silicon oxide, etc., which is underneath the platinum, are almost the same, the silicon oxide is also etched during ion milling.

In order to increase processing accuracy, research and development has been quite active in the precision processing technology with respect to the platinum layer and metal oxide dielectric thin film by means of a dry etching process, where $Cl_2$ and HBr are used as the etching gas (see, Extended Abstracts, Autumn Meeting 1991, The Japan Society of Applied Physics, 9P-ZF-17, p. 516; Extended Abstracts, Spring Meeting 1993, The Japan Society of Applied Physics, 30a-ZE-3, pp. 577).

Figure 8A:
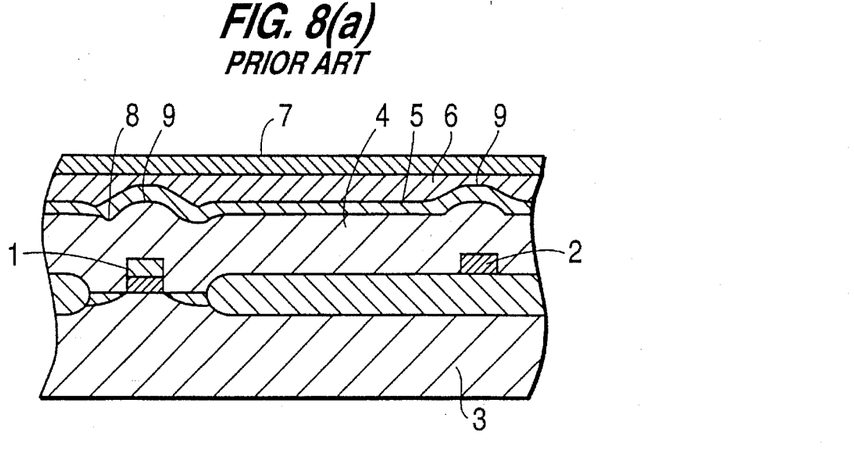
FIGS. 8(a)–8(c) show cross-sectional views of a conventional method for manufacturing semiconductor devices.

A conventional method for manufacturing semiconductor devices is described with reference to FIGS. 8(a)–(c). As shown in FIG. 8(a), a silicon oxide layer 4 is formed as an insulation layer on top of a silicon substrate 3 on which a circuit element 1 and a wiring 2 are already shaped. Over the silicon oxide layer 4 is a first platinum layer 5, a film of high dielectric constant material or ferroelectric material (hereinafter referred to as dielectric film) 6 and a second platinum layer 7.

The silicon oxide layer 4 reflects unevenness due to the circuit element 1 or wiring 2 already shaped on the silicon substrate 3 to have a hollow 8 or protrusion 9 on its surface, as shown in FIG. 8(a). Because dielectric film 6 is spin-coated on the uneven surface of silicon oxide layer 4, thickness of the dielectric film 6 is large at the hollow 8, and small at the protrusion 9.

Figure 8B:
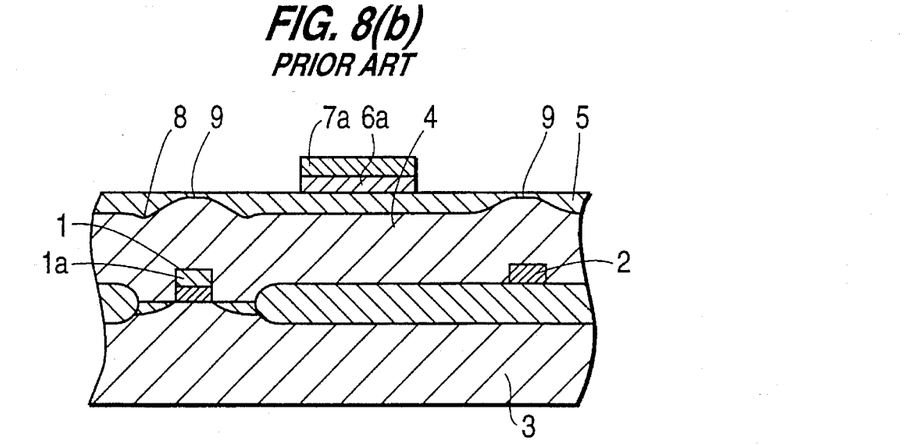

Next, as shown in FIG. 8(b), top electrode 7a and capacitance insulation film 6a are formed by dry-etching the second platinum layer 7 and dielectric film 6 with $Cl_2$, HBr as the etching gas. The facility used for the etching is a magnetron reactive ion etching (RIE) mode dry etcher.

Through the same etching procedure the first platinum layer 5 is etched to form a bottom electrode 5a; and a capacitor is thus formed. A layer to protect the capacitor, electrode wiring and protection layer for the electrode wiring are formed through process steps not shown in the figure; and a semiconductor device is completed.

Figure 9:
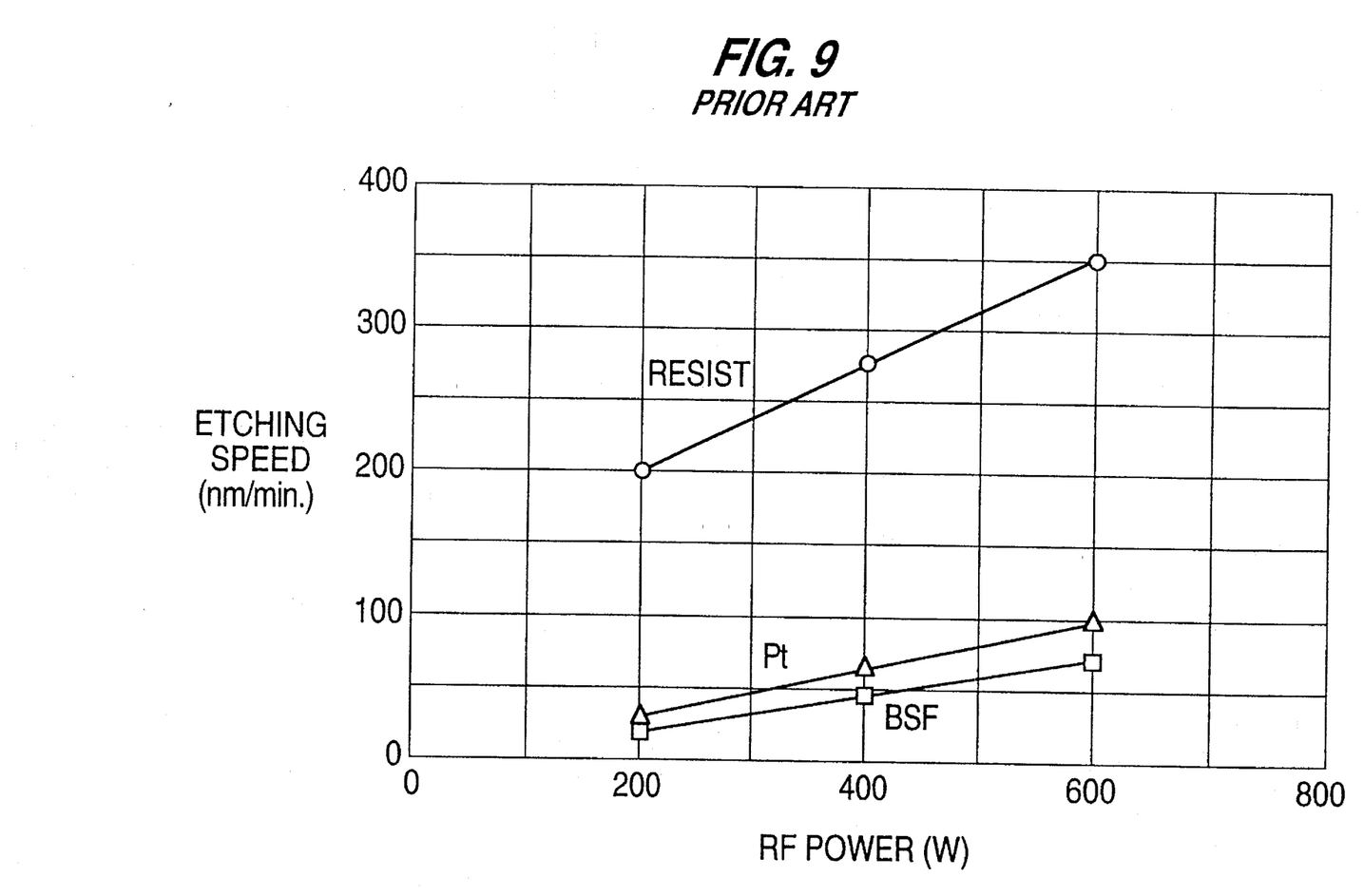
FIG. 9 is a characteristics chart showing the relationship between the etching speeds of platinum, BST and resist and the HF power, when $Cl_2$ gas is used as the etching gas in a conventional manufacturing method.

An example of the etching characteristics on platinum, high dielectric constant material ($BaSrTiO_3$, hereinafter referred to as BST) and resist is explained below when $Cl_2$ is used as the etching gas. FIG. 9 shows dependence of the etching speed of platinum, BST and resist to RF power. Where, the horizontal axis denotes RF power, the vertical axis denotes etching speeds of platinum, BST and resist.

The facility used for the etching is magnetron RIE mode dry etcher. The etcher conditions are: $Cl_2$ gas flow 20 sccm, gas pressure 1 Pa, RF power within a range between 200 W and 600 W, wafer temperature during etching below 20° C. as its back surface is cooled with He.

FIG. 9 exhibits that platinum etching speed is increased from 30 nm/min. to 100 nm/min., BST etching speed is increased from 20 nm/min. to 70 nm/min. and resist etching speed is increased from 200 nm/min. to 350 nm/min., when RF power is raised from 200 W to 600 W.

When, the platinum/resist etching speed ratio increases from about 0.15 to about 0.29 along with the increase of RF power from 200 W to 600 W. The BST/resist etching speed ratio also increases from about 0.10 to about 0.20. Under any condition, the etching speed of resist is much faster than that of platinum and BST.

The time required to etch the platinum layer (200 nm thick) and BST (200 nm thick) with RF power at 600 W is 4 min. 52 sec. The etching quantity of the resist during this time span is calculated from the resist etching speed to be 1703 nm, a very large value. This means that, if the resist layer is thinner than 1700 nm, the resist is entirely etched while etching is conducted on the platinum and BST. If this is to be prevented, a thick resist layer of more than about 3 μm thick has to be used.

As described above, however, when $Cl_2$ etching gas is used, the etching speed of resist is very high relative to that of platinum and BST. Consequently, while platinum and BST are being etched for a certain required thickness, the resist layer is also etched significantly. In order to prevent this from occurring a thick-layer resist needs to be used. But the thick-layer resist affects the definition level of the mask pattern at photolithography, rendering the formation of a fine pattern very difficult.

The etching speed of the silicon oxide layer is about 2.5 times faster than that of the platinum layer. So, as shown in FIG. 8(c), during formation of bottom electrode 5a, its underlayer, the silicon oxide layer 4 is significantly etched.

Figure 8C:
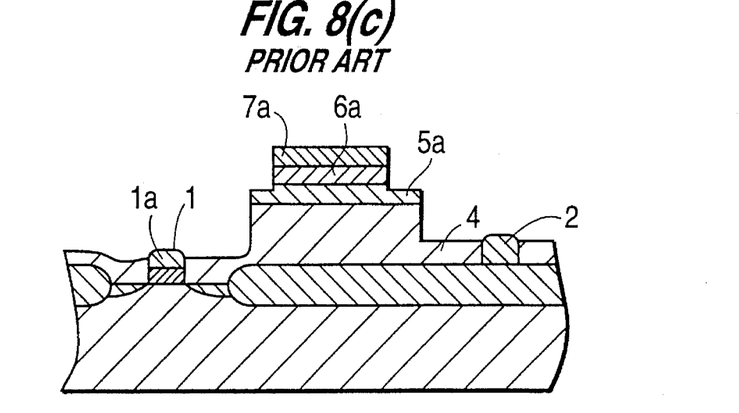

The problem with etching the silicon oxide layer 4 is illustrated in FIGS. 8(b) and 8(c). Before the thick part of first platinum layer 5 (located on the hollow 8 of silicon oxide layer 4) is completely etched off, the etching gas, which already etched the thin part of first platinum layer 5 (located on the extrusion 9 of silicon oxide layer 4), quickly attacks the underlying silicon oxide layer 4 to etch it off, and when gate electrode 1a of circuit element 1 and wiring 2 are exposed, they are also etched, rendering the transistor and other circuit element 1 inoperable.

In the case of ion milling where Ar gas is used as the etching gas, because the ratio of the etching speed of the second platinum layer 7 and dielectric film 6 to the etching speed of the silicon oxide layer 4 is low, when forming a capacitor in two separate etching process steps (e.g., etching on the second platinum layer 7 and dielectric film 6, and then on the first platinum layer 5), it is extremely difficult to stop the etching procedure so that the first platinum layer is not etched.

In the case of dry etching on platinum and ferroelectric material, because of its slow etching speed, the throughput of the production facility is poor.

SUMMARY OF THE INVENTION

The objective of this invention is to offer a new method for manufacturing semiconductor devices having a built-in capacitor which is formed by slowing the etching speed on the resist, making the ratio of etching speed of platinum and dielectric material to resist large, and by selectively dry-etching the platinum and dielectric material at a fast etching speed.

Further, another objective of this invention is to offer a new method of manufacturing semiconductor devices, wherein, even if sufficient time is provided for overetching during the process to form the bottom electrode of the capacitor, the silicon oxide layer underneath the electrode is only minimally etched, hence circuit elements and wirings, etc. are protected from damage; thereby highly reliable semiconductor devices can be manufactured.

This invention comprises process steps to form, on a substrate in which circuit elements and wirings, etc. are already shaped, an insulation layer, a first metal layer, a dielectric film and a second metal layer, one after another, and then, form a top electrode and a capacitance film by dry etching the second metal layer and the dielectric film, and form a bottom electrode by dry etching the first metal layer; wherein, at least the etching gas for dry etching the second metal layer is a mixed gas containing hydrogen halide and oxygen, having a ratio of oxygen against the total of hydrogen halide and oxygen set at about 10%–35%.

As the hydrogen halide, HBr is used, and a gas containing hydrocarbon such as chloroform is used as the etching gas.

This invention employs a silicon oxide layer as the insulation layer on the substrate, and a platinum layer or palladium layer as the first and second metal layers. Dry etching of the second metal layer and dielectric film is conducted in a low pressure region not higher than about 5 Pa, where the etching speed is high.

Further, in this invention, an insulation layer, a first metal layer, a dielectric film and a second metal layer are formed on a substrate on which circuit elements and wirings, etc. are already shaped; and then a top electrode and a capacitance insulation layer are formed by dry etching the second metal layer and dielectric film in the low pressure region where the etching speed is high. When the first metal layer is exposed, the dielectric film left unetched on the first metal layer is removed under the high pressure region where the etching speed relative to the first metal layer is low, and then the mask pattern is applied, and the bottom electrode is formed by dry etching the first metal layer under the low pressure region where the etching speed is high.

Therefore, according to this invention, where a mixed gas of hydrogen halide and oxygen is used as the etching gas, the etching speed on silicon oxide layer can be made sufficiently low relative to that on the second metal layer made of a platinum layer or a palladium layer; in this way, the excessive etching of the silicon oxide layer underlying the first metal layer is avoided, and damage to the circuit elements and wiring, etc. underneath the silicon oxide layer can be prevented. Hence, reliable semiconductor devices may be manufactured at a high production yield rate. By properly controlling the etching speed of platinum and ferroelectric material the throughput of manufacturing facilities may be raised.

Furthermore, the ratio of etching speed of the platinum and dielectric material to the resist can be increased by lowering the etching speed on the resist. Therefore, etching of the platinum and dielectric material may be conducted by using a mask of normal layer-thickness resist (generally speaking, about 1.2 µm to about 2.0 µm thick), instead of using a conventional thick-layer resist (about 3 µm and thicker).

The invention itself, together with further objects and attendant advantages, will best be understood by reference to the following detailed description taken in conjunction with the accompanying drawings.

DESCRIPTION OF PREFERRED EMBODIMENTS

Embodiment 1 of this invention is described below referring to FIGS. 1(a)–(d) and FIGS. 2(a)–(c), where the same constituent parts as the conventional parts shown in FIG. 8 are identified with the same numerals and their explanations are omitted, explaining only those elements that are different from the conventional method.

In FIGS. 1(a)–(d) and FIGS. 2(a)–(c), the circuit element 1 and wiring 2 as shown in FIG. 8 are omitted, and only the sector of a capacitor is described.

Figure 1A:
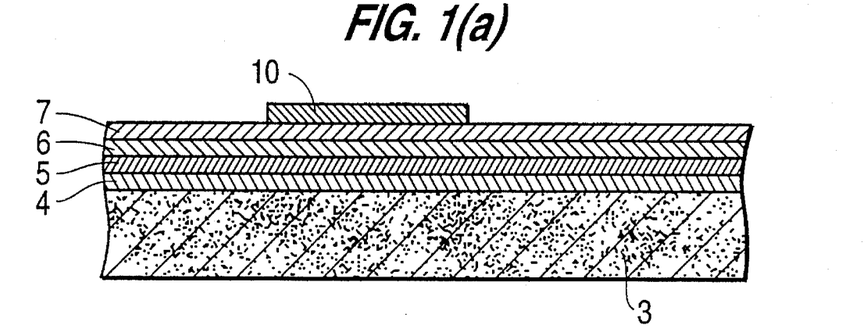
FIGS. 1(a)–1(d) are cross-sectional views showing the first half of the process steps in embodiment 1 of this invention.
Figure 1B:
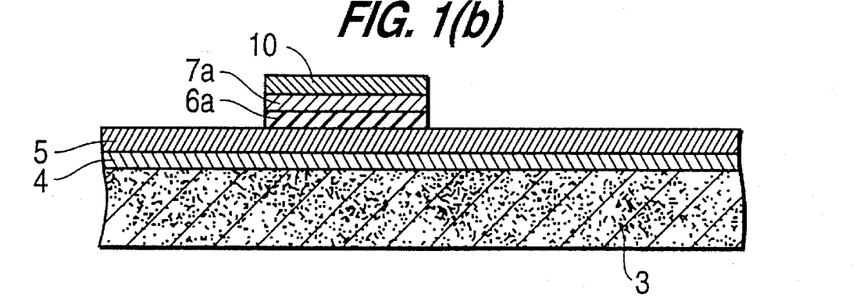
Figure 1C:
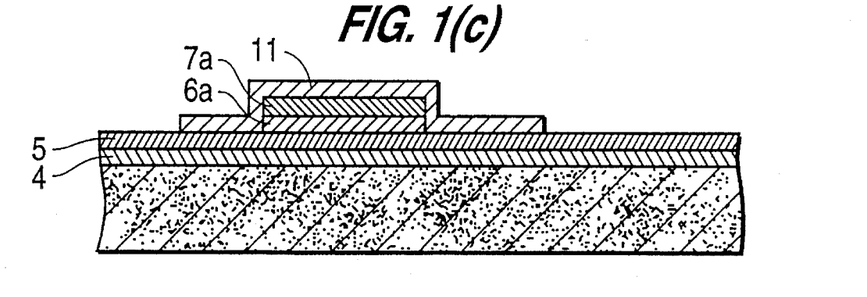
Figure 1D:
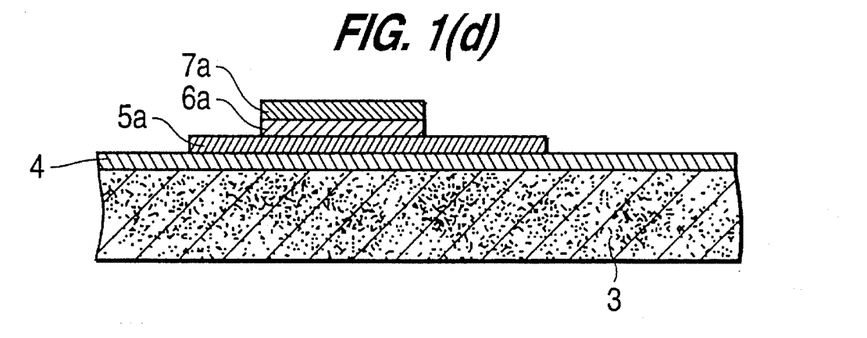

First, as shown in FIG. 1(a), an insulation layer 4 of silicon oxide, etc. is formed on the substrate 3 made of silicon, etc. On top of the insulation layer 4 is a first platinum layer 5 of about 200 nm thickness. On top of the first platinum layer 5 is a dielectric film 6 having a high dielectric constant material or ferroelectric material of about 200 nm thickness. Further on top of the dielectric film 6 is a second platinum layer 7 of about 200 nm thickness. The dielectric film 6 is formed by means of the spin coating method. Then, top electrode 7a and a capacitance insulation film 6a are formed by dry etching the second platinum layer 7 and dielectric film 6, through a resist layer 10 applied on the second platinum layer 7. In this way, a device as shown in FIG. 1(b) is formed. Next, as shown in FIG. 1(c), the top electrode 7a, capacitance insulation film 6a and a part of the first platinum layer 5 are covered with a second resist layer 11 to etch the first platinum layer 5 with a mixed gas of HBr and $O_2$. Bottom electrode 5a is thus formed, as shown in FIG. 1(d).

Figure 2A:
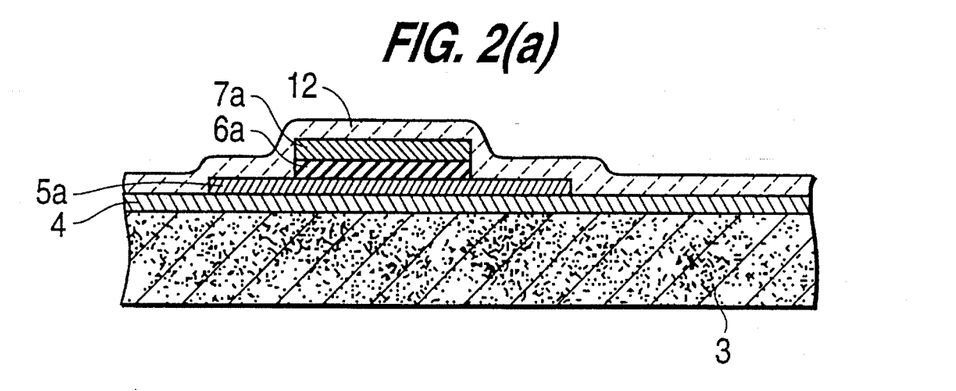
FIGS. 2(a)–2(c) are cross-sectional views showing the second half of the process steps in embodiment 1.
Figure 2B:
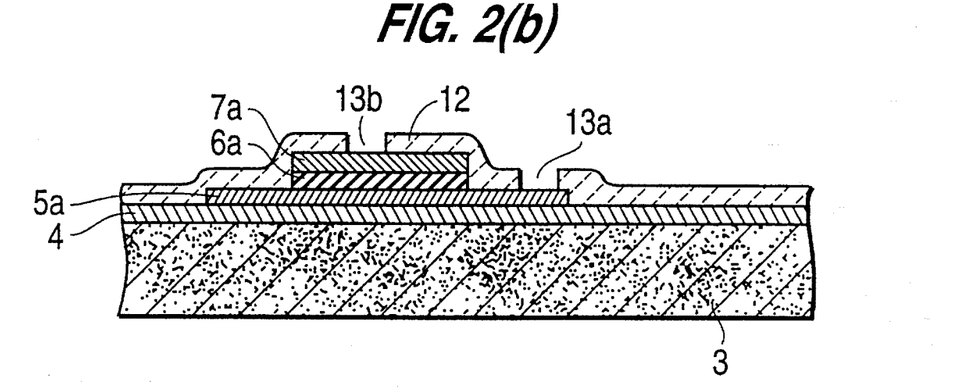
Figure 2C:
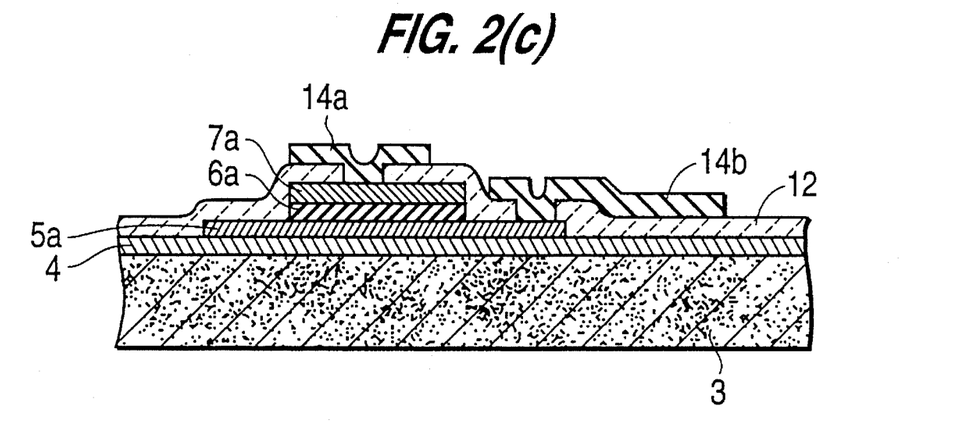

As shown in FIG. 2(a), an interlayer insulation layer 12 is coated over the entire surface, contact holes 13a and 13b are provided above the bottom electrode 5a and top electrode 7a, respectively (FIG. 2(b)), and electrode wirings 14a and 14b, which connect to the top electrode 7a and bottom electrode 5a, respectively, via the contact holes 13b, 13a, are formed to complete a capacitor (FIG. 2(c)).

The use of a mixed gas of HBr and $O_2$ as the etching gas in dry etching the silicon oxide layer 4, the first platinum layer 5 and the second platinum layer 7, is explained below with reference to FIG. 3.

Figure 3:
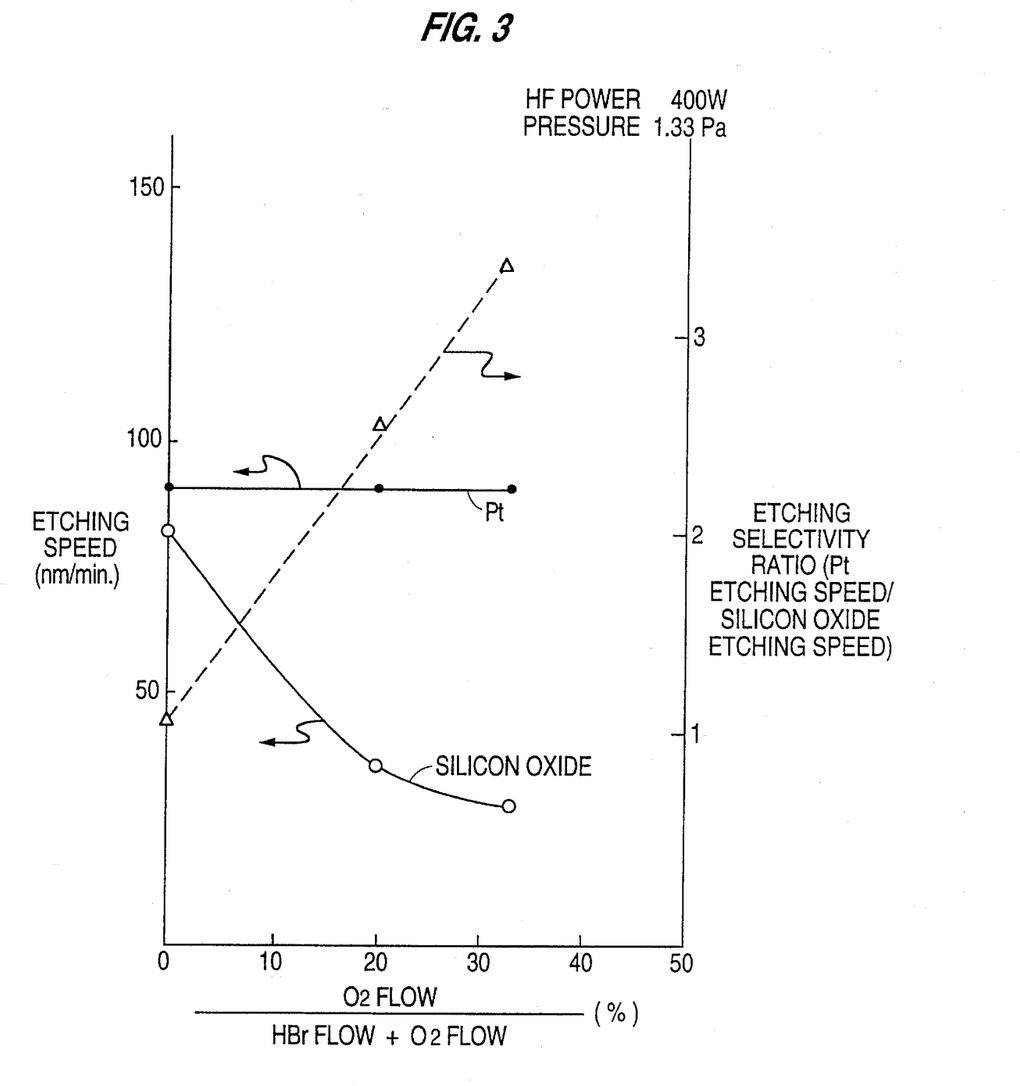
FIG. 3 is a characteristic chart showing the etching speed of the etching gas used in embodiment 1.

FIG. 3 shows the etching speeds of platinum and silicon oxide when HBr and $O_2$ mixed gas is used. The left vertical axis denotes the etching speeds of platinum and silicon oxide, the right vertical axis denotes the etching selectivity ratio (platinum etching speed/silicon oxide etching speed), and the horizontal axis indicates percentage of $O_2$ flow to the HBr and $O_2$ total etching gas flow. The etching facility used is a magnetron RIE mode dry etcher, with HF power 400 W and pressure 1.33 P during etching.

As indicated in FIG. 3, the etching speed on silicon oxide when HBr alone is used as the etching gas is about 80 nm/min., which is about half the speed when chloroform is used as the etching gas, or almost the same level as that on platinum (90 nm/min.). Namely, the platinum/silicon oxide etching selectivity ratio is improved to approximately 1.

When $O_2$ is mixed with HBr such that $O_2$ comprises about 30% of the total flow of etching gas, the speed of etching on silicon oxide decreases to about ⅓ as compared with the case of HBr alone; while the etching speed on platinum stays almost unchanged. This means that the platinum/silicon oxide etching selectivity ratio is improved to more than 3. In practical cases the process can be maintained stable when the ratio is 1.5 and up, therefore, the quantity of $O_2$ to the total etching gas flow may be chosen from the range of about 10%–35%.

In the case when platinum is dry etched using HBr and $O_2$ mixed gas, the silicon oxide reacts with Br and $O_2$ to compose a non-volatile compound which piles up on the silicon oxide layer 4 to protect the silicon oxide layer 4, lowering the etching speed. This makes it possible to selectively etch the first platinum layer 5. Namely, in completely etching off the first platinum layer 5, the silicon oxide layer 4 is never substantially etched as was the case in the conventional manufacturing method. Thus, possible damage to the circuit elements and wirings which are located underneath the silicon oxide layer 4 is avoided.

Although a platinum layer is used as the top electrode 7a and bottom electrode 5a in this embodiment, the same effect is also obtained by the use of a less reactive metal, such as palladium.

Besides $O_2$ gas used in this embodiment as the gas to be mixed to HBr, a compound gas containing oxygen may also be used.

As described above, in this embodiment, where a mixed gas of oxygen and hydrogen halide such as HBr is used as the etching gas for forming the bottom electrode 5a made of platinum, etc., only the first metal layer 5 made of platinum, etc. is selectively etched off, and etching on the silicon oxide layer 4 is suppressed; therefore the circuit elements and wiring, etc. underneath the silicon oxide layer are not damaged.

The method for manufacturing semiconductor devices in a second embodiment is the same as that in embodiment 1 shown in FIGS. 1(a)–(d) and FIGS. 2(a)–(c), except the second embodiment uses chloroform as the etching gas on the platinum and dielectric material.

Dry etching on the platinum and dielectric material in the second embodiment using chloroform ($CHCl_3$) as the etching gas is explained below.

Figure 4:
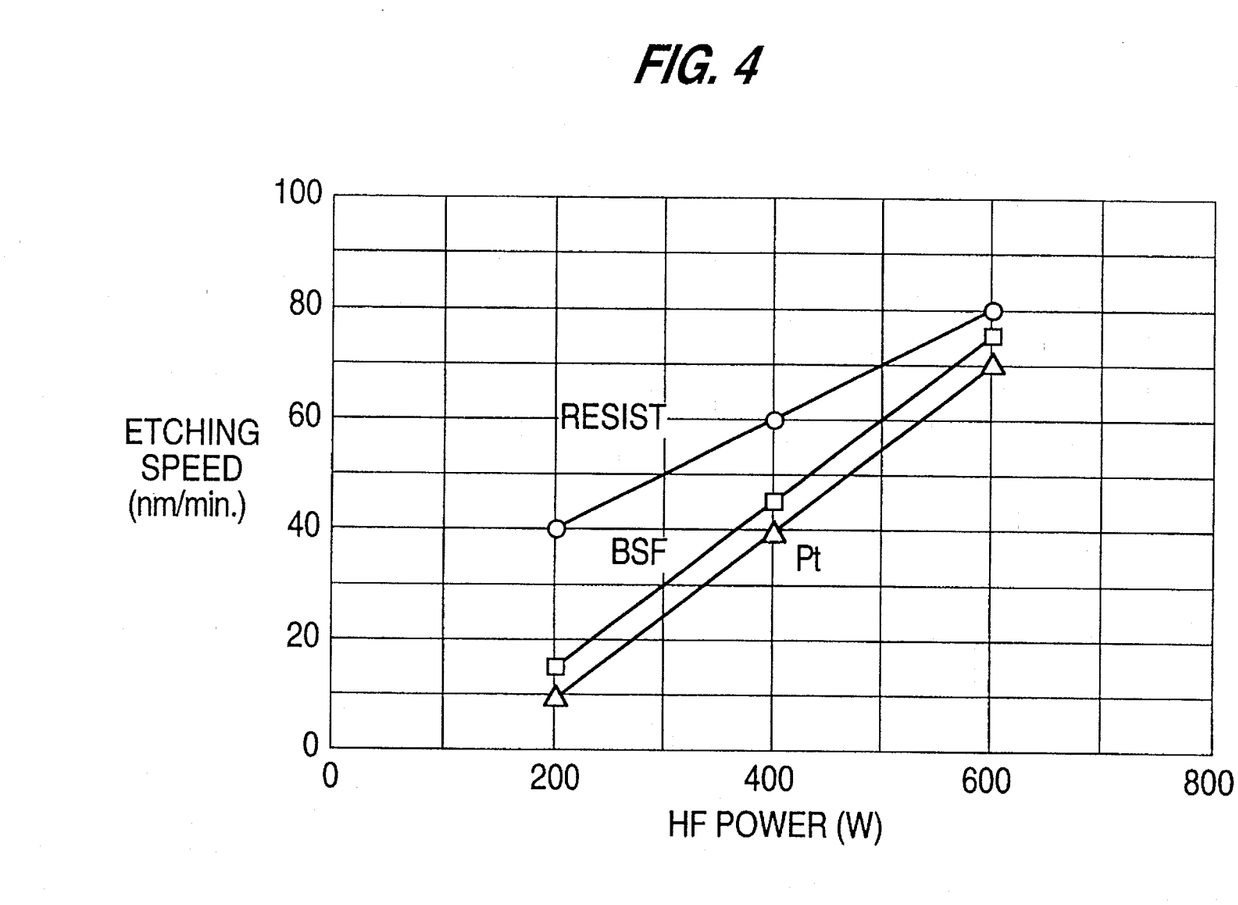
FIG. 4 is a characteristics chart showing the relationship between the etching speeds of platinum, BST and resist and the HF power, when chloroform is used as etching gas in embodiment 2 of this invention.

FIG. 4 shows the dependence of etching speeds of platinum, BST and resist to HF power when chloroform ($CHCl_3$) is used as the etching gas. In FIG. 4, the horizontal axis denotes HF power, and the vertical axis etching speeds of platinum, BST and resist. The etching facility used is a magnetron RIE mode dry etcher. The etching conditions are as follows: chloroform ($CHCl_3$) flow 20 sccm, gas pressure 1 Pa, and HF power within a range of about 200 W–600 W.

As FIG. 4 indicates, along with the elevation of HF power from about 200 W to about 600 W the speed of etching on platinum increases from about 10 nm/min to about 70 nm/min, on BTS from about 15 nm/min to about 75 nm/min, and on resist from 40 nm/min to 80 nm/min. Platinum/resist etching speed ratio increases from about 0.25 to about 0.88 when HF power is raised from about 200 W to about 600 W. BST/resist etching speed ratio increase from about 0.38 to about 0.94.

The time needed to etch platinum (200 nm thick layer) and BST (200 nm thick film) is 5 min. 32 sec. at HF power load 600 W. During that time frame, the resist is calculated to have been etched off by 443 nm; which represents a remarkable improvement as compared with the conventional etching quantity 1703 nm.

As explained above, according to the second embodiment, by using chloroform ($CHCl_3$) as the etching gas to etch platinum and BST, the speed of etching on the resist is decreased, and the ratio of etching speed of platinum and BST to resist can be made larger. These changes in etching speed make it possible to conduct etching on platinum and BST using a normal layer thickness resist (generally speaking, thicknesses of about 1.2 μm to about 2.0 μm), instead of a conventionally used thick resist (about 3 μm and thicker). Therefore, a fine pattern can be shaped with a high processing precision, without deteriorating the level of definition of a mask pattern.

When $Cl_2$ gas is used, carbon (C) and hydrogen (H), being the elements contained in the resist, react with $Cl_2$ gas to compose $CCl_4$, HCl, which are then separated and exhausted. The etching is considered to proceed this way, and the speed of etching on the resist increases.

On the other hand, when chloroform gas is used, the etching speed of the resist is decreased because of the carbon and hydrogen contained in the chloroform gas. It is believed that either the reaction with carbon and hydrogen in the resist is made less active, or a film of carbon and hydrogen is polymerized during etching which piles up on the resist while etching is going on, rendering the etching speed retarded.

In this embodiment, chloroform ($CHCl_3$) is used as an example of the etching gas. However, besides chloroform, other gases containing hydrocarbon may be used to obtain the same results. A mixed gas of $Cl_2$ gas and chloroform, and a mixed gas of HBr and chloroform may also be used to obtain the same results.

Figure 5:
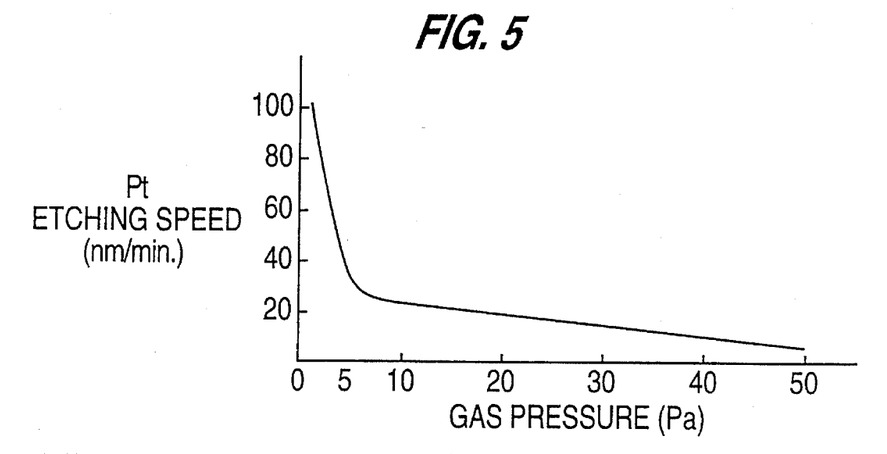
FIG. 5 is a characteristic chart showing the relationship between the etching speed of platinum and the pressure of etching gas in embodiment 3 of this invention.

A third embodiment of this invention is described with reference to FIG. 5, FIG. 6 and FIG. 7. In FIG. 5, the horizontal axis denotes gas pressure and the vertical axis speed of etching on platinum. The etching facility used is a magnetron RIE mode dry etcher. The etching conditions are as follows: etching gas flow 20 sccm and HF power 600 W. The substrate temperature during etching is below about 20° C. because its back surface is cooled with helium (He).

As illustrated in FIG. 5, the speed of etching on platinum increases rapidly from about 30 nm/min to about 100 nm/min when the gas pressure decreases from about 5 Pa to about 1 Pa. Meanwhile, when the gas pressure is increased from about 5 Pa to about 50 Pa, the etching speed slows down from less than about 30 nm/min to about 5 nm/min.

The difference in the speed of etching on platinum due to different gas pressure regions is explained below.

In dry etching the platinum in the low pressure region (1–5 Pa), the physical spatter etching dominates, and the etching speed increases steeply along with the lowering pressure. In the high pressure region (5–50 Pa), the physical spatter etching is weak, and etching by the chemical reaction with platinum and etching gas seems to be proceeding, where the etching speed is very slow.

As explained in the foregoing description, according to this embodiment the speed of etching on platinum during platinum etching can be increased steeply by conducting the etching in the low pressure region, about 1 Pa-5 Pa.

Figure 6:
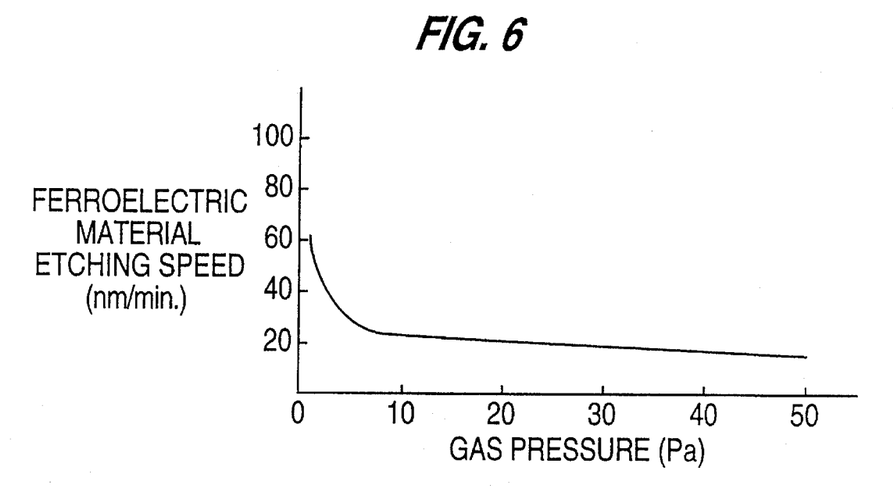
FIG. 6 is a characteristic chart showing the relationship between the etching speed of dielectric material and the pressure of etching gas in embodiment 3.

FIG. 6 shows the dependence of the etching speed of the dielectric material on the gas pressure when a mixed gas of $Cl_2$ gas and chloroform is used as etching gas. In FIG. 6, the horizontal axis denotes the gas pressure and the vertical axis denotes the etching speed on the dielectric material.

In this embodiment, the dielectric material used as an example is $BaSrTiO_3$ (BST). The etching facility used is a magnetron RIE mode dry etcher. The etching conditions are as follows: etching gas flow 20 sccm and HF power 600 W. The substrate temperature during etching is below 20° C. because its back surface is cooled with He.

As FIG. 6 shows, the etching speed on the dielectric material increases from about 30 nm/min to about 60 nm/min along with the decreasing gas pressure from about 5 Pa to about 1 Pa. Meanwhile, when the gas pressure goes higher (from about 5 Pa to about 50 Pa), the etching speed gradually slows down (from about 30 nm/min to about 15 nm/min).

The difference in the etching speed on the dielectric material due to different gas pressure regions is explained below.

In dry etching the dielectric material in the low pressure region (1–5 Pa), the physical spatter etching dominates, and the etching speed increases steeply along with the lowering pressure. In the high pressure region (5–50 Pa), the physical spatter etching is weak, and etching by the chemical reaction with the dielectric material and etching gas occurs.

Figure 7:
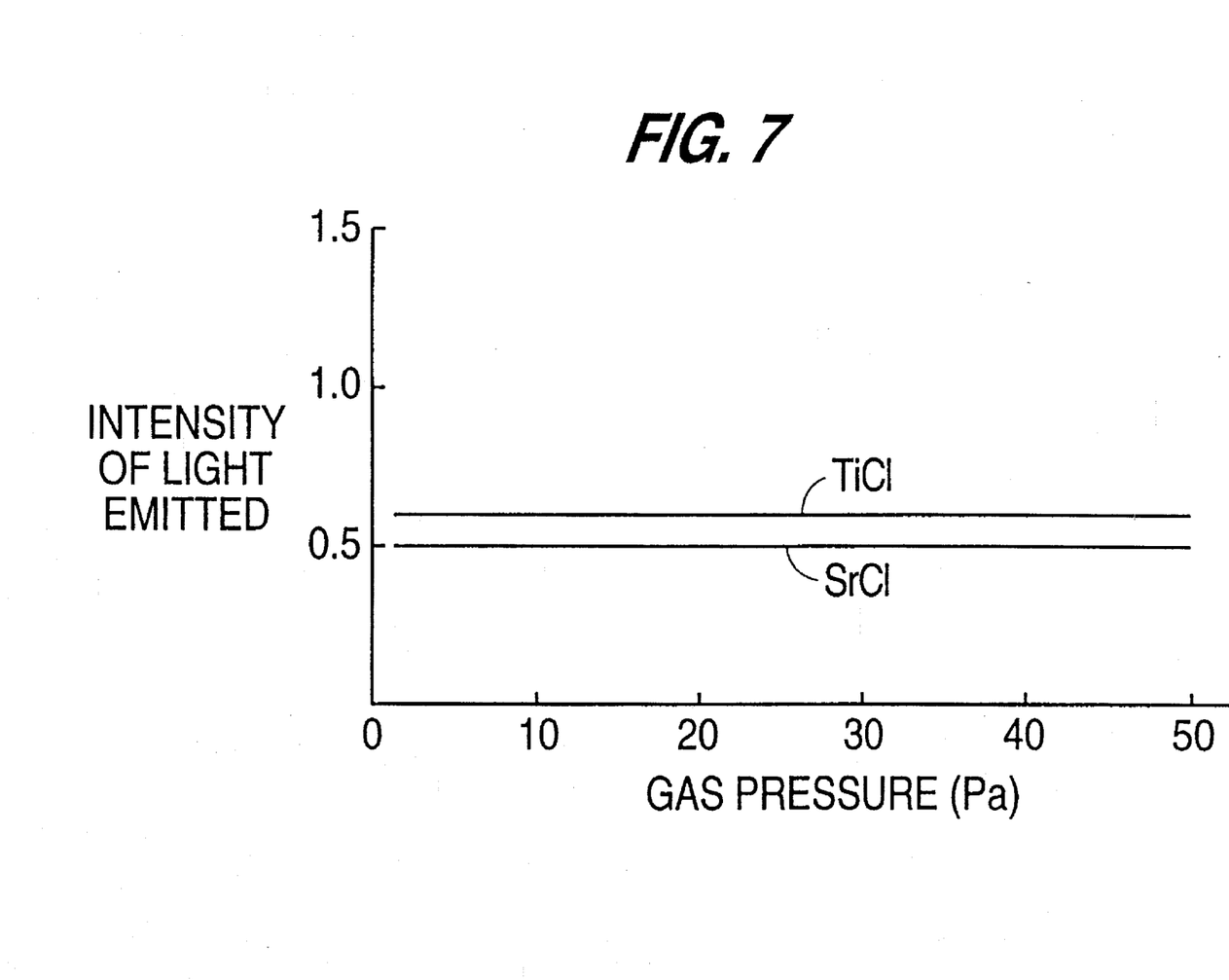
FIG. 7 is a characteristic chart showing the relationship between the intensity of the light emitted while the dielectric material is being etched and the pressure of etching gas in embodiment 3.

FIG. 7 shows the dependence of the intensity of light emitted during etching of the dielectric material to the gas pressure. The etching conditions remain the same as those in FIG. 6, and the horizontal axis denotes the gas pressure and vertical axis the intensity of light emitted.

During etching, light emission of 396.1 nm wavelength from SrCl and of 419.2 nm from TiCl were observed. The intensity of the light emission from the SrCl during etching stays constant at about 0.5, irrespective of the gas pressure; and that from TiCl also stays constant at about 0.6, irrespective of the gas pressure.

From the above, it is understood that in the high pressure region (5–50 Pa), where the etching speed is almost constant, etching on the dielectric material proceeds by chemical etching. It is also understood that in the low pressure region (1–5 Pa), where the etching speed increases steeply, when the intensity of light emitted is not different from that in the high pressure region (FIG. 7), the effect of physical spatter etching is added to the etching by chemical reaction. As a result, in the low pressure region, the etching speed is increased accordingly.

Based on the above, the etching speed can be increased by setting the etching conditions within the 1–5 Pa low pressure region. Thus, there is an improved production throughout.

When etching the dielectric material, according to this embodiment the etching speed can be increased steeply by performing the etching in the 1–5 Pa low pressure region, and the etching by chemical reaction can be performed in the 5–50 Pa high pressure region.

The process steps of the method for manufacturing semiconductor devices according to a fourth embodiment are the same as those shown in FIG. 1. Therefore, the following explanation is directed to the conditions and means for the manufacturing method.

On the insulation layer 4 formed on a substrate of silicon, etc., the first platinum layer 5 of 200 nm thickness is formed as a bottom electrode, on the first platinum layer 5 the dielectric film 6 is formed of 180 nm thickness, and then on the dielectric film 6 the second platinum layer 7 of 200 nm thickness is formed for a top electrode.

The first resist layer 10 is then applied on the second platinum layer 7 to etch down the second platinum layer 7 and the dielectric film 6. When the first platinum layer 5 is exposed, the etching is discontinued. The ratio of etching speed of the dielectric film 6 to the first platinum layer 5 underneath the film 6 needs to be high. Then, the second resist layer 11 is applied to etch off the first platinum layer 5, in order to form the bottom electrode 5a. In this step, the size of the first platinum layer 5 needs to be large enough to provide contacts through the interlayer insulation layer 12 at two points between the second platinum layer 7/the first platinum layer 5 and electrode wirings 14a/14b, which are located above the respective platinum layers.

For this purpose, in the process to etch down the second platinum layer 7 and dielectric film 6, first, the second platinum layer 7 must be etched in the low pressure region, where the speed of etching on platinum is high. The etching conditions in this process are: etching gas flow 20 sccm, gas pressure 1 Pa, HF power 600 W and etching time 2 minutes. Next, start the etching of dielectric film 6 in the low pressure region, where the etching speed is high. The etching conditions should be: etching gas flow 20 sccm, gas pressure 1 Pa, HF power 600 W and etching time 3 minutes. As soon as the first platinum layer 5 is exposed, shift the gas pressure to the high pressure region, in order that the remaining dielectric film 6 still on the surface of first platinum layer 5 is chemically etched off while maintaining the first platinum layer 5 unetched. The etching conditions at this process are: etching gas flow 20 sccm, gas pressure 50 Pa, HF power 600 W and etching time 1 min.

In this embodiment, the ratio of etching speed of the dielectric material to platinum increases from about 0.6 to about 3, along with the increasing gas pressure from about 1 Pa to about 50 Pa.

As explained in the foregoing description, platinum and dielectric material can be selectively etched by shifting the pressure region of the etching gas.

As the next step, the first platinum layer 5 is etched in the low pressure region, where platinum etching speed is high. The etching conditions at this step are: etching gas flow 20 sccm, gas pressure 1 Pa, HF power 600 W and etching time 2 minutes.

In embodiment 3 and embodiment 4 above, a mixed gas of $Cl_2$ gas and chloroform is used as an example of etching gas. However, $Cl_2$ gas alone may be used as etching gas, and the same effects may be obtained by controlling the pressure region during the dry etching process in the same way as described in embodiments 3 and 4 above.

As described above, according to the fourth embodiment, a desirable etching speed may be chosen to fit each platinum and dielectric material. Also a required ratio of the etching speed of platinum to dielectric material may be chosen by properly controlling the pressure region of the etching gas.

Through the process steps as explained by the foregoing description, a capacitor consisting of the second platinum layer 7 as top electrode, dielectric film 6 and the first platinum layer 5 as bottom electrode may be formed with high precision and without difficulty of manufacturing.

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. A method of manufacturing a semiconductor device comprising the steps of:

forming an insulation layer, a first metal layer, a dielectric film, and a second metal layer on a substrate having circuit elements formed thereon;

dry etching said second metal layer and said dielectric film to form a top electrode and a capacitance insulation film, wherein at least this dry etching step is performed using mixed gas containing hydrogen halide and oxygen; and dry etching said first metal layer to form a bottom electrode after dry etching said second metal layer and said dielectric film.

2. A method of manufacturing a semiconductor device according to claim 1, wherein the percentage of oxygen in the etching gas of hydrogen halide and oxygen is about 10% to about 35% of the total etching gas flow.

3. A method of manufacturing a semiconductor device according to claim 1 or claim 2, wherein the hydrogen halide is HBr.

* * * * *